(12) United States Patent
Lin et al.

(10) Patent No.: US 6,462,358 B1
(45) Date of Patent: Oct. 8, 2002

(54) LIGHT EMITTING DIODE AND METHOD FOR MANUFACTURING THE SAME

(75) Inventors: Jin-Ywan Lin, Jungli (TW); Kuang-Neng Yang, Taoyuan County (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/068,193

(22) Filed: Feb. 6, 2002

(30) Foreign Application Priority Data

Sep. 13, 2001 (TW) .................................. 90122715 A

(51) Int. Cl.[7] .............................................. H01L 33/00
(52) U.S. Cl. ............................ 257/99; 257/79; 257/103
(58) Field of Search ............................ 257/99, 103, 79

(56) References Cited

U.S. PATENT DOCUMENTS

| | | | | |
|---|---|---|---|---|
| 5,300,788 A | * | 4/1994 | Fan et al. ...................... 257/13 |
| 5,376,580 A | * | 12/1994 | Kish et al. ..................... 438/26 |
| 5,708,280 A | * | 1/1998 | Lebby et al. ................... 257/80 |
| 5,990,497 A | * | 11/1999 | Kamakura et al. ........... 257/100 |
| 6,316,792 B1 | * | 11/2001 | Okazaki et al. .............. 257/103 |
| 6,319,778 B1 | * | 11/2001 | Chen et al. .................... 257/94 |
| 6,365,951 B1 | * | 4/2002 | Worley .................. 250/214 LA |
| 2002/0053872 A1 | * | 5/2002 | Yang et al. ................... 313/506 |

* cited by examiner

Primary Examiner—Olik Chaudhuri
Assistant Examiner—William C Vesperman
(74) Attorney, Agent, or Firm—Snell & Wilmer L.L.P.

(57) ABSTRACT

The present invention disclosed a light emitting diode (LED) and method for manufacturing the same. The light emitting diode includes a transparent substrate connected to an epitaxial layer with absorption substrate via a transparent adhesive layer. Then, the absorption substrate is removed to form a light emitting diode with the transparent substrate. Because of the low light absorption of the transparent substrate, the present invention provides high luminescence efficiency. Furthermore, because the first metal bonding layer is electrical connected with the first ohmic contact layer by the electrode connecting channel, the voltage is decreased and the current distribution is increased in the fixed current to improve the luminous efficiency of a light emitting diode.

17 Claims, 5 Drawing Sheets

LIGHT EMITTING DIODE AND METHOD FOR MANUFACTURING THE SAME

BACKGROUND OF INVENTION

1. Field of Invention

The invention relates to a light emitting diode, and more specifically to an AlGaInP light emitting diode

2. Description of Prior Art

The conventional AlGaInP light emitting diode (LED) with a double heterostructure, as shown in FIG. 6, includes a n-type GaAs substrate 3, a lower n-type $(Al_xGa_{1-x})_{0.5}In_{0.5}P$ cladding layer 4 with x=0.7~1.0, a $(Al_xGa_{1-x})_{0.5}In_{0.5}P$ active layer 5, an upper n-type $(Al_xGa_{1-x})_{0.5}In_{0.5}P$ cladding layer 6 with x=0.7~1.0, and a p-type current spreading layer 7 with high energy band gap. The material of the p-type current spreading layer 7 is selected from GaP, GaAsP, GaInP and AlGaAs.

The light emitting wavelength of LED varies with the Al composition of the active layer 5 from green light of 555 μm to red light of 650 μm. However, when the light is emitted from the active layer 5 to the GaAs substrate 3, because of the smaller energy band gap of substrate 3, the light is absorbed by the substrate 3 resulting in forming a LED of low efficiency.

To prevent the light absorption of substrate 3, in conventional techniques, a distributed Bragg reflector (DBR) is formed on the GaAs substrate to reflect the light. However, the DBR layer only reflects the incident light nearly perpendicular to the substrate. Therefore, the application of DBR layer is in efficient.

Besides, wafer-bonded transparent substrate (TS) of $(Al_xGa_{1-x})_{0.5}In_{0.5}P$/GaP LED has been proposed to improve the luminous efficiency. The TS AlGaInP LED is fabricated by the VPE (Vapor Phase Epitaxy) technique to form a p-type GaP window layer with thickness of about 50 μm. And then, the GaAs substrate is removed to expose the n-type AlGaInP lower cladding layer. Furthermore, the exposed n-type AlGaInP lower cladding layer is connected to the n-type GaP substrate.

Because the wafer-bonded technique is directly connecting two types of III-V compound semiconductor together, the process is completed in pressuring and heating at higher temperature. The luminous efficiency of TS AlGaInP LED is twice brighter than that of the absorbing substrate AlGaInP LED. However, because of the complexity of manufacturing layers of TS AlGaInP LED, and high resistance in conductivity between the interface of non-ohmic contact layer, it's difficult to get high producing yield and lower the cost.

An AlGaInP/metal/SiO$_2$/Si mirror-substrate (MS) LED is proposed in another prior art. The Si substrate and the epitaxial layer are connected by AuBe/Au. However, the luminous intensity of MS AlGaInP LED (about 90 mcd) is 40% less than the luminous density of TS AlGaInP LED in operation current of 20 mA.

SUMMARY OF INVENTION

The present invention presents a light emitting diode (LED) structure and a method for manufacturing the LED. The LED includes an epitaxial layer formed on an AlGaInP multi-layer epitaxial structure. The AlGaInP multi-layer epitaxial structure is connected to a transparent substrate by a transparent adhesive layer. The material of the AlGaInP multi-layer epitaxial structure is selected from a group consisting of homostructure, single heterostructure (SH), double heterostructure (DH), and multiple quantum well (MQW).

Furthermore, the LED comprises a first ohmic contact layer and a second ohmic contact layer, an electrode connecting channel for electrically coupling a first metal bonding layer to the first ohmic contact layer. Therefore, the first and the second metal bonding layers are in the same side related to the transparent substrate.

The present invention provides a method of manufacturing a light emitting diode. The method includes forming a first ohmic contact layer on an epitaxial structure. Then, the first ohmic contact and the epitaxial structure connect to a transparent substrate via a transparent adhesive layer, such as BCB (B-staged bisbenzocyclobutene), epoxy, and the like. Then, the substrate is removed.

Subsequently, the structure of the LED is etched in two steps. First, a portion of the multi-layer epitaxial structure is removed in width of about 3~6 mils in etching process to expose the epitaxial layer. Then, the lower portion of the exposed epitaxial layer is removed in width of about 1~3 mils to form a channel exposing the first ohmic contact layer. A second ohmic contact layer is formed on the lower cladding layer. Then, the first and the second metal bonding layers are connected to the first and the second ohmic contact layers, respectively. Therefore, the first and the second metal bonding layers are in the same side relative to the transparent substrate.

One advantage of the invention is to provide a high-brightness LED readily connected to a transparent substrate at lower temperature to prevent vaporization of group V elements during the adherence process.

Another advantage of the present invention is to provide a high-brightness LED integrated with low cost transparent substrate, such as glass, to improve the production yield at low cost.

Another advantage of the present invention is to provide an electrode channel of better current distribution and smaller voltage when operating at the same current. The electrode channel also improves the emitting efficiency in the same voltage.

Another advantage of the present invention is to provide a high-brightness LED connected to a transparent substrate by soft transparent adhesive layer. Even if the surface of the epitaxial layer is rough, the implement of the transparent adhesive layer is secure.

BRIEF DESCRIPTION OF THE APPENDED DRAWINGS

DETAILED DESCRIPTION OF THE INVENTION

Figure 1:
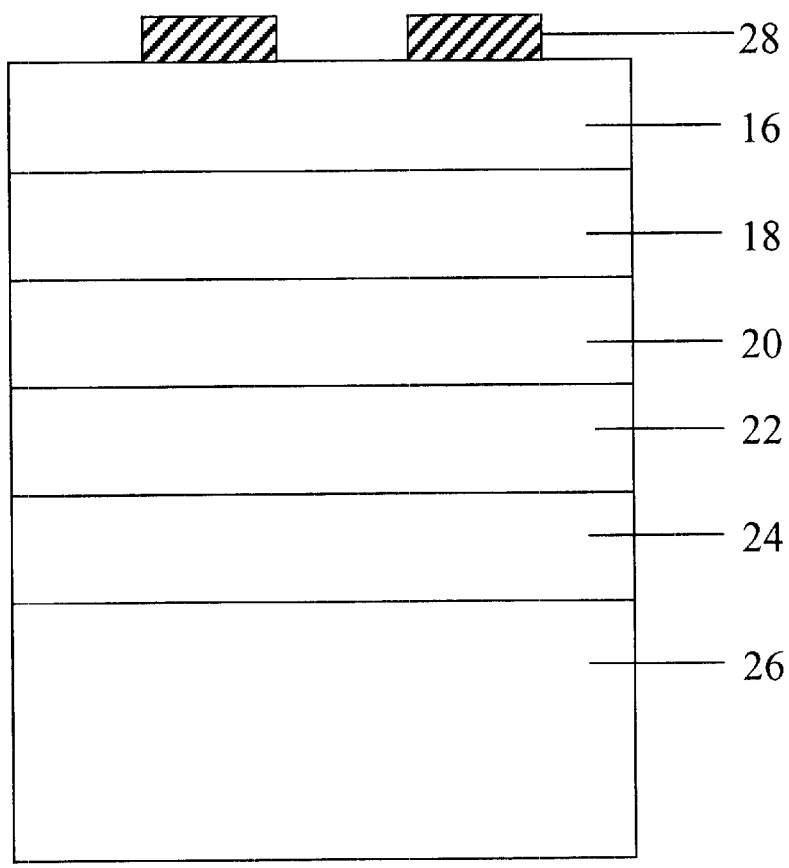
FIG. 1 to FIG. 3 show a cross-sectional view of one embodiment of AlGaInP light emitting diode according to the present invention.

The present invention discloses a structure of a light emitting diode (LED) and a method for manufacturing the LED. With reference to FIG. 1, the LED includes an n-type GaAs substrate 26, an etching stop layer 24, an n-type $(Al_xGa_{1-x})_{0.5}In_{0.5}P$ lower cladding layer 22 with x=0.5~1.0, a $(Al_xGa_{1-x})_{0.5}In_{0.5}P$ active layer 20 with x=0~0.45, and a p-type $(Al_xGa_{1-x})_{0.5}In_{0.5}P$ upper cladding layer 18 with x=0.5~1.0, and a p-type epitaxial layer 16. A p-type ohmic contact layer 28 is formed on the epitaxial layer 16, sequentially arranged in a first direction.

The p-type epitaxial layer 16 is selected from AlGaAs, AlGaInP and GaAsP. The epitaxial layer 16 for preventing light absorption of the active layer 20 has a larger energy band gap than the active layer 20, and a high carrier concentration for being the ohmic contact layer.

The foregoing active layer 20 is the AlGaInP with x=0~0.45, and the upper cladding layer 18 and lower cladding layer 22 is the AlGaInP with x=0.5~1.0. An example of the active layer 20 is $Ga_{0.5}In_{0.5}P$ with x=0 resulting in the wavelength of the light emitting diode of 635 nm of the LED.

While this invention has been described with reference to an illustrative embodiment, this embodiment is not intended to be construed in a limiting sense. The active layer 20 is selected from a group consisting of homostructure, single heterostructure (SH), double heterostructure (DH), and multiple quantum well (MQW). The DH structure, such as shown in FIG. 1, includes a $(Al_xGa_{1-x})_{0.5}In_{0.5}P$ lower cladding layer 22 with thickness of about 0.5~3.0 $\mu$m, a $(Al_xGa_{1-x})_{0.5}In_{0.5}P$ active layer 20 with thickness of about 0.5~2.0 $\mu$m and a $(Al_xGa_{1-x})_{0.5}In_{0.5}P$ upper layer 18 with thickness of about 0.5~3.0 $\mu$m.

The etching stop layer 24 is selected from a group of III-V compound semiconductor, such as GaInP, or AlGaAs. Any material having lattice matched with the GaAs substrate 26 is suitable for the etching stop layer 24. Besides, the etching rate of the etching stop layer 24 is lower than the etching rate of the substrate 26.

In the first embodiment, as shown in FIG. 1, the etching rate of the lower cladding layer 22 is also lower than the etching rate of the substrate 26. Therefore, if the thickness of the lower cladding layer 18 is thick enough, the etching stop layer 24 is not necessary to provide.

Figure 2:
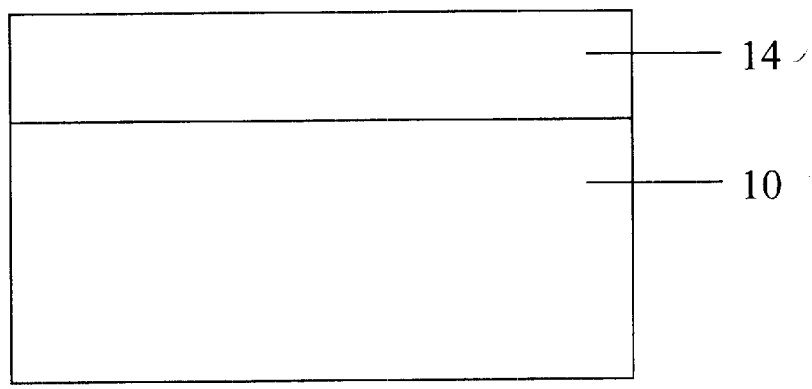

Then, as shown in FIG. 2, a transparent adhesive layer 14 and a transparent substrate (TS) 10 are illustrated. The transparent adhesive layer 14 is selected from BCB (B-staged bisbenzocyclobutene), or other adhesive materials of transparent character, such as epoxy.

The purpose of the transparent substrate 10 serves as a support to prevent the multi-layer epitaxial structure 20 of the LED from breaking during the process. Therefore, the transparent substrate 10 is not limited to single crystalline substrate. The transparent substrate 10 is selected from polycrystal substrate and amorphous substrate, such as sapphire, glass, GaP, GaAsP, ZnSe, ZnS, ZnSSe, or SiC, to lower the cost.

Then, the transparent substrate 10 is connected to the p-type ohmic contact layer 28 and the epitaxial layer 16 by pressuring and heating the transparent adhesive layer 14 at 250° C. for a while. In order to improve the connection of the epitaxial layer 16 and the transparent substrate 10, an adhesive promoter is coated on the surface of the transparent substrate 10, prior to the adhesive layer 14 coated on the transparent substrate 10. Furthermore, for a better adhering effect, when the epitaxial layer 16 is connected to the transparent substrate 10, the transparent adhesive layer 14 is heated at the temperature of about 60° C.~100° C. to remove the organic solvent. Then, the temperature is rose to about 200° C.~600° C. Therefore, the transparent substrate 10 is connected tightly to the epitaxial layer 16 by the transparent adhesive layer 14.

Then, the substrate 26 is etched by a corrosive etchant, such as $5H_3PO_4:3H_2O_2:3H_2O$ or $1NH_4OH:35H_2O_2$. If the etching stop layer 24 is made of light-absorption materials, such as GaInP or AlGaAs, the etching stop layer 24 must be removed by the same solution.

Figure 3:
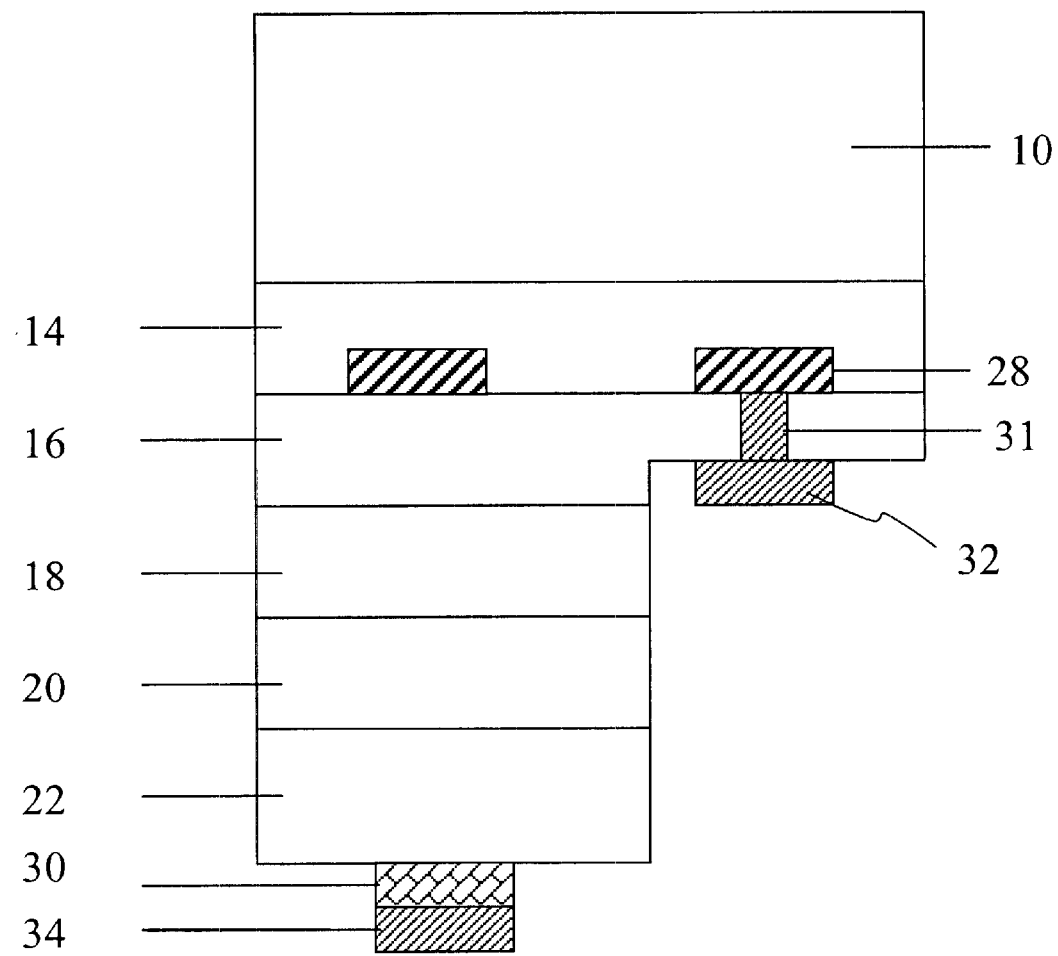

Then, the structure is etched in two steps. First, a portion of the multi-layer epitaxial structure, including an active layer 20 sandwiched between the upper cladding layer 18 and the lower cladding layer 22, is removed in width of about 3~6 mils by dry etching or wet etching process to expose the epitaxial layer 16. Subsequently, the lower portion of the exposed epitaxial layer 16 is removed in width of about 1~3 mils to form a channel exposing the p-type ohmic contact 28. Then, an n-type ohmic contact layer 30 is formed on the lower cladding layer 22 in the second direction, and the second direction is opposite to the first direction. Subsequently, a first metal bonding layer 32 is formed on the epitaxial layer 16 and the channel is filled by Au or Al to form an electrode channel 31, which is connected the p-type ohmic contact 28 in the second direction. A second metal bonding layer 34 is formed on the n-type ohmic contact layer 30 in the second direction. Therefore, the first and the second metal bonding layers 32, 34 are in the same side related to the transparent substrate 10, as shown in FIG. 3.

According to the invention, in the operation current of 20 mA, the wavelength light of the LED is 635 nm. And the output power of the light of the present invention is about 4 mW, which is twice larger than the power of light of the traditional AlGaInP LED with the light-absorbed substrate.

This embodiment of the AlGaInP LED is not intended to be construed in a limiting sense. The present invention can use other material, such as AlGaAs for red light LED, too.

Figure 4:
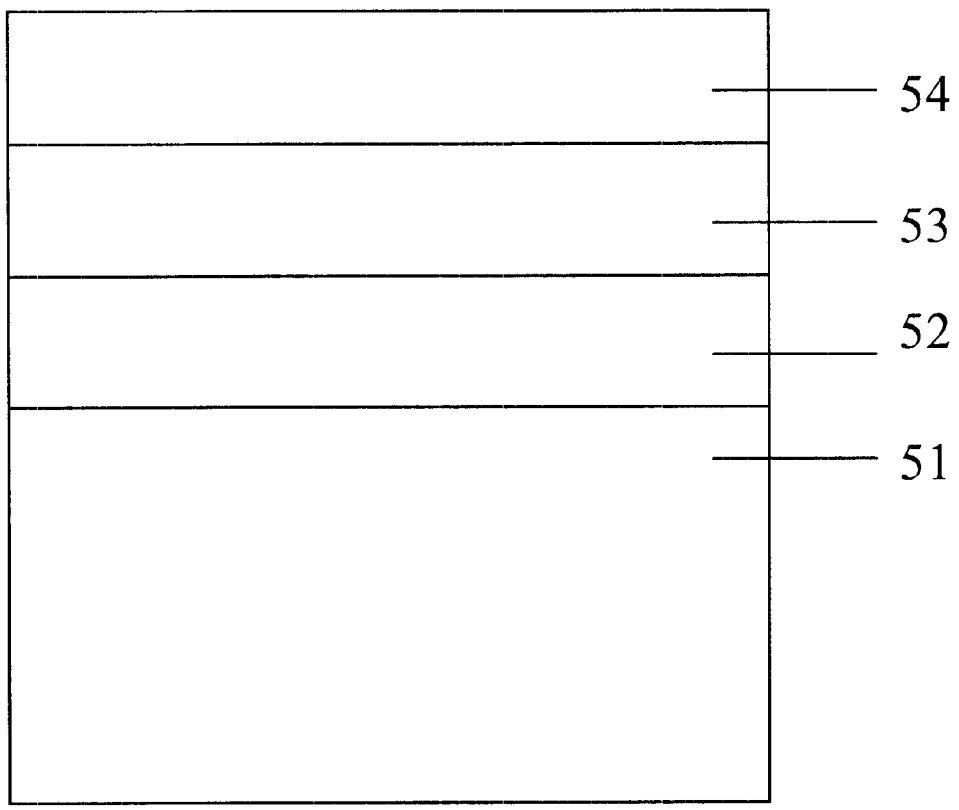
FIG. 4 and FIG. 5 show a cross-sectional view of another embodiment of AlGaAs light emitting diode according to the present invention.
Figure 5:
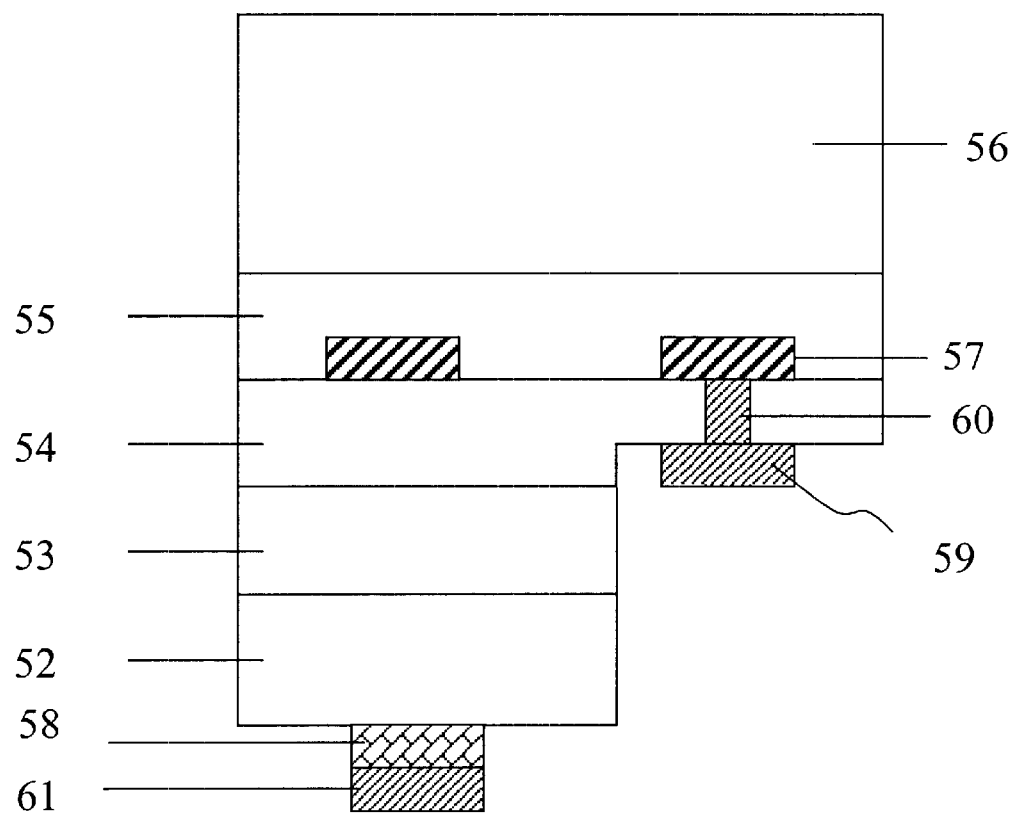
Figure 6:
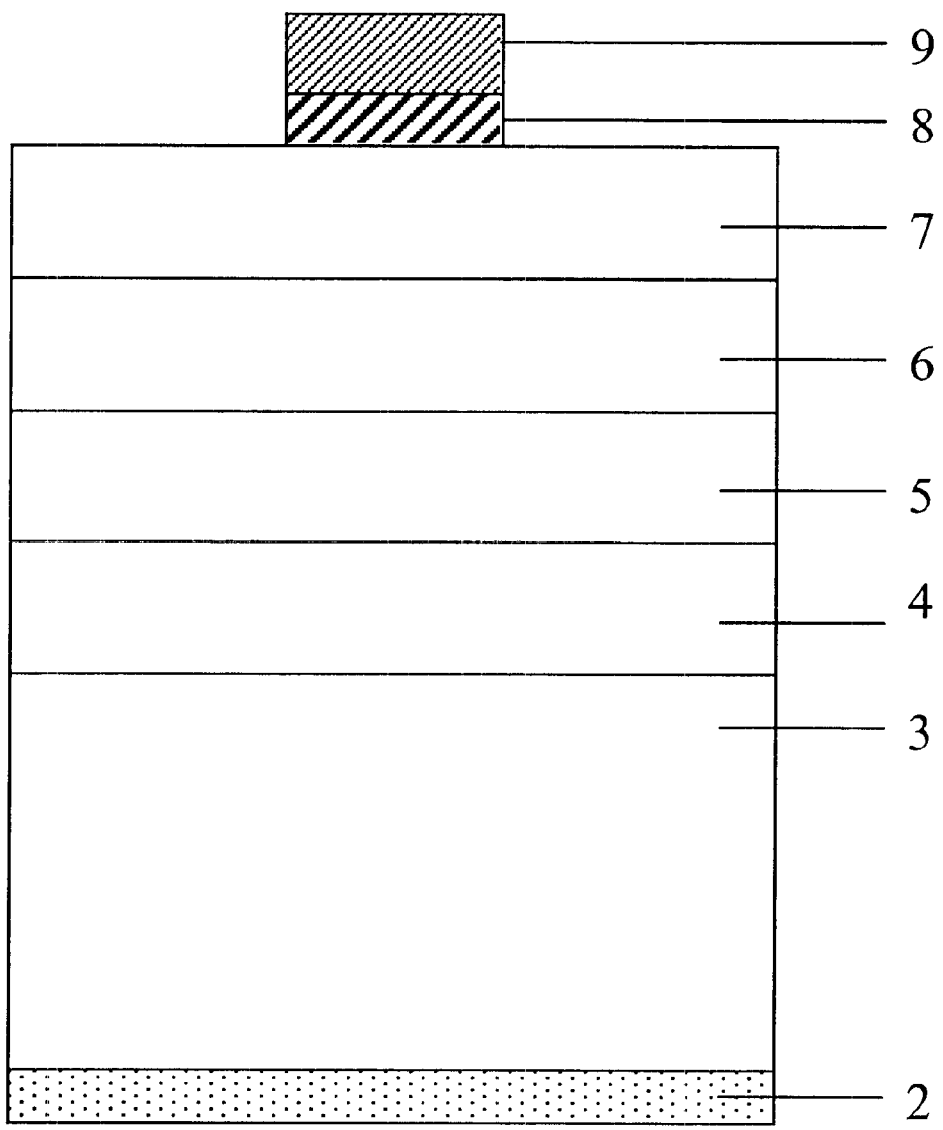
FIG.6 shows a cross-sectional view of a conventional light emitting diode.

Please referring to FIG. 4, in the second embodiment, a light emitting diode structure according to the present invention is formed on a GaAs substrate 51 in a first direction. The multi-layer epitaxial structure includes an n-type AlGaAs lower cladding layer 52, an AlGaAs active layer 53, and a p-type AlGaAs upper cladding layer 54. The Al composition of the lower cladding layer 52 is about 70%~80%, and the thickness of the lower cladding layer 52 is about 0.5~3.0 $\mu$m. The Al composition of the upper cladding layer 54 is about 70%~80% and the thickness of the upper cladding layer 54 is about 0.5~3.0$\mu$m. The Al composition of the active layer 53 is about 35% and the thickness of the active layer 53 is about 0.5~2.0$\mu$m. Then, as shown in FIG. 5, a p-type ohmic contact layer 57 is formed on the upper cladding layer 52 in the first direction. Then, a transparent substrate 56 connects the upper cladding layer 54 to the p-type ohmic contact layer 57 by a transparent adhesive layer 55.

Subsequently, the substrate 51 is removed by a corrosive etchant, such as $NH_4OH: H_2O_2=1.7:1$. Moreover, a portion of the multi-layer epitaxial structure is removed by wet etching or dry etching to form a channel exposing the p-type ohmic contact layer 57. Then, an n-type ohmic contact layer 58 is formed on the lower cladding layer 52 in a second direction. And then, a first metal bonding layer 59 is formed on the upper cladding layer 54 in the second direction and an electrode channel 60 is formed in the upper cladding layer 54. A second metal bonding layer 61 is formed on the n-type ohmic contact layer 58 in the second direction. Therefore, the first and the second metal bonding layers 59, 61 are in the same side related to the transparent substrate 10, as shown in FIG. 5.

According to the invention, in the operation current of 20 mA, the light wavelength of the red light AlGaAs LED is 650 nm. And the output power of the light of the present invention is twice larger than the output power of the light of the traditional AlGaAs LED with the light-absorbed substrate.

The present invention presents a light emitting diode with transparent substrate 10 and an electrode channel 31 connecting the p-type ohmic contact 28 to the first metal bonding layer 32. As a result, the first and the second metal bonding layers 32 and 34 are in the same side related to the transparent substrate 10. Therefore, the chip-package of flip chip technique is implemented, which eliminates the traditional wire bonding resulting in improvement of reliability of chip. Furthermore, the luminous efficiency is improved due to elimination light absorption of the transparent substrate 10. Moreover, because the material, such as sapphire, glass, or SiC, of the transparent substrate 10 is hard, the thickness of the substrate is reduced to about 100 μm without breaking during the process. Therefore, the present invention provides a thin and small LED.

The present invention presents the transparent substrate 10 connected to the epitaxial structure via a soft transparent adhesive layer 14. Therefore, even if the surface of the epitaxial structure is rough, the transparent substrate 10 is connected tightly to the epitaxial structure via the transparent adhesive layer 14.

While the invention has been described in connection with what is presently considered to be the most practical and preferred embodiments, it is to be understood that the invention is not to be limited to the discovered embodiments. The invention is intended to cover various modifications and equivalent arrangement included within the spirit and scope of the appended claims.

What is claimed is:

1. A light emitting diode, comprising:
   an AlGaInP multi-layer epitaxial structure including an active layer sandwiched between an upper cladding layer and a lower cladding layer;
   an epitaxial layer formed on said upper cladding layer in a first direction;
   a first ohmic contact layer formed on said epitaxial layer in said first direction;
   a transparent adhesive layer positioned on said first ohmic contact layer in said first direction;
   a transparent substrate adhered to said first ohmic contact layer via said transparent adhesive layer in said first direction;
   a second ohmic contact layer formed on said lower cladding layer in a second direction, said second direction being opposite to said first direction;
   a first metal bonding layer formed on said epitaxial layer in said second direction;
   a second metal bonding layer formed on said second ohmic contact layer in said second direction; and
   an electrode connecting channel, formed within said epitaxial layer, for electrically coupling said first metal bonding layer to said first ohmic contact layer.

2. The light emitting diode according to claim 1, wherein said AlGaInP multi-layer epitaxial structure is selected from a group consisting of homostructure, single heterostructure, double heterostructure (DH), and multiple quantum well structure (MQW) of AlGaInP.

3. The light emitting diode according to claim 1, wherein said epitaxial layer is formed of a p-type material.

4. The light emitting diode according to claim 1, wherein said first ohmic contact layer is formed of a p-type material, and said second ohmic contact layer is formed of an n-type material.

5. The light emitting diode according to claim 1, wherein said transparent substrate is selected from a group consisting of sapphire, glass, GaP, GaAsP, ZnSe, ZnS, ZnSSe, and SiC.

6. The light emitting diode according to claim 1, wherein said transparent adhesive layer is selected from a group consisting of BCB (B-staged bisbenzocyclobutene) and epoxy.

7. The light emitting diode according to claim 1, wherein said metal bonding layer is selected from a group consisting of Al and Au.

8. The light emitting diode according to claim 1, wherein said electrode connecting channel is the same material as said first metal bonding layer.

9. A method for manufacturing a light emitting diode, comprising:
   providing a substrate;
   forming an etching stop layer on said substrate in a first direction;
   forming an AlGaInP multi-layer epitaxial structure, comprising an active layer sandwiched between an upper cladding layer and a lower cladding layer, on said etching stop layer in said first direction;
   forming an epitaxial layer on said upper cladding layer in said first direction;
   forming a first ohmic contact layer on said epitaxial layer in said first direction;
   providing a transparent substrate;
   connecting said transparent substrate to said first ohmic contact layer and said epitaxial layer via a transparent adhesive layer coated on said transparent substrate;
   removing said substrate and said etching stop layer;
   removing a portion of said AlGaInP multi-layer epitaxial structure and a portion of said epitaxial layer to expose said epitaxial layer;
   forming a channel within said epitaxial layer to expose said first ohmic contact layer;
   forming a first metal bonding layer on said exposed epitaxial layer in a second direction, said second direction being opposite to said first direction;
   filling said channel to form an electrode connecting channel for electrically coupling said first metal bonding layer to said first ohmic contact layer;
   forming a second ohmic contact layer on said lower cladding layer in said second direction; and
   forming a second metal bonding layer on said second ohmic contact layer in said second direction.

10. The method according to claim 9, wherein said substrate is formed of GaAs.

11. The method according to claim 9, wherein said AlGaInP multi-layer epitaxial structure is selected from a group consisting of homostructure, single heterostructure, double heterostructure (DH), and multiple quantum well structure (MQW) of AlGaInP.

12. The method according to claim 9, wherein said transparent substrate is selected from a group consisting of sapphire, glass, GaP, GaAsP, ZnSe, ZnS, ZnSSe, and SiC.

13. The method according to claim 9, wherein said epitaxial layer is formed of a p-type material.

14. The method according to claim 9, wherein said first ohmic contact layer is formed of a p-type material, and said second ohmic contact layer is formed of an n-type material.

15. The method according to claim 9, wherein said transparent adhesive layer is selected from a group consisting of BCB (B-staged bisbenzocyclobutene) and epoxy.

16. The method according to claim 9, wherein a step of connecting said transparent substrate to said epitaxial layer and said first ohmic contact layer via said transparent adhesive layer comprises:
   pressuring and heating at 60° C.~100° C. during connecting process; and
   pressuring and heating at 200° C.~600° C. during connecting process.

17. The light emitting diode according to claim 9, wherein said metal bonding layer is selected from a group consisting of Al and Au.

* * * * *